United States Patent
Kobayashi (10) Patent No.: US 9,754,873 B2
(45) Date of Patent: Sep. 5, 2017

(54) STORAGE DEVICE WITH CONTACTS CONTACTING DIFFERENT WIRING LAYERS AND MANUFACTURING METHOD THEREOF

(71) Applicant: Toshiba Memory Corporation, Tokyo (JP)

(72) Inventor: Yusuke Kobayashi, Kuwana Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 14/839,873

(22) Filed: Aug. 28, 2015

(65) Prior Publication Data

US 2016/0276584 A1    Sep. 22, 2016

(30) Foreign Application Priority Data

Mar. 19, 2015   (JP) .................................. 2015-056980

(51) Int. Cl.
H01L 45/00 (2006.01)
H01L 21/02 (2006.01)
H01L 23/522 (2006.01)
H01L 27/24 (2006.01)

(52) U.S. Cl.
CPC ...... *H01L 23/5226* (2013.01); *H01L 27/2409* (2013.01); *H01L 27/2481* (2013.01); *H01L 45/085* (2013.01); *H01L 45/1233* (2013.01); *H01L 45/148* (2013.01)

(58) Field of Classification Search
CPC ..... H01L 27/2427; H01L 45/06; H01L 45/41; H01L 45/12; H01L 45/16; H01L 23/5226; H01L 45/1233; H01L 27/2481; H01L 45/148

See application file for complete search history.

(56) References Cited

U.S. PATENT DOCUMENTS

| 8,274,068 B2 * | 9/2012 | Nagashima | H01L 27/0207 257/2 |
| 2010/0203672 A1 * | 8/2010 | Eun | H01L 27/2409 438/102 |
| 2011/0049465 A1 | 3/2011 | Nagashima | |
| 2011/0233505 A1 * | 9/2011 | Nitta | H01L 27/24 257/3 |
| 2012/0147650 A1 | 6/2012 | Samachisa et al. | |

* cited by examiner

*Primary Examiner* — Benjamin Sandvik
*Assistant Examiner* — Damon Hillman
(74) *Attorney, Agent, or Firm* — Patterson & Sheridan, LLP

(57) ABSTRACT

A storage device includes a first wiring layer, a second wiring layer above the first wiring layer, a third wiring layer above the second wiring layer, a first contact in electrical contact with the first and third wiring layers and electrically insulated from the second wiring layer, a second contact in electrical contact with the first and second wiring layers and electrically insulated from the third wiring layer, and an insulating layer in contact with the second contact and above the third wiring layer, the first contact, and the second contact.

19 Claims, 9 Drawing Sheets

STORAGE DEVICE WITH CONTACTS CONTACTING DIFFERENT WIRING LAYERS AND MANUFACTURING METHOD THEREOF

CROSS-REFERENCE TO RELATED APPLICATION

This application is based upon and claims the benefit of priority from Japanese Patent Application No. 2015-056980, filed Mar. 19, 2015, the entire contents of which are incorporated herein by reference.

FIELD

Embodiments described herein relate generally to a storage device and a manufacturing method thereof.

BACKGROUND

In recent years, semiconductor memory devices have become more highly integrated. One example is a three-dimensional memory device. One type of a three-dimensional memory device is a three-dimensional stacked cross-point type memory device.

DETAILED DESCRIPTION

Embodiments provide low cost storage device of a small size and a method of manufacturing the same.

In general, according to one embodiment, a storage device includes a first wiring layer, a second wiring layer above the first wiring layer, a third wiring layer above the second wiring layer, a first contact in electrical contact with the first and third wiring layers and electrically insulated from the second wiring layer, a second contact in electrical contact with the first and second wiring layers and electrically insulated from the third wiring layer, and an insulating layer in contact with the second contact and above the third wiring layer, the first contact, and the second contact.

Hereinafter, embodiments of the present invention will be described referring to drawings.

First Embodiment

Figure 1:
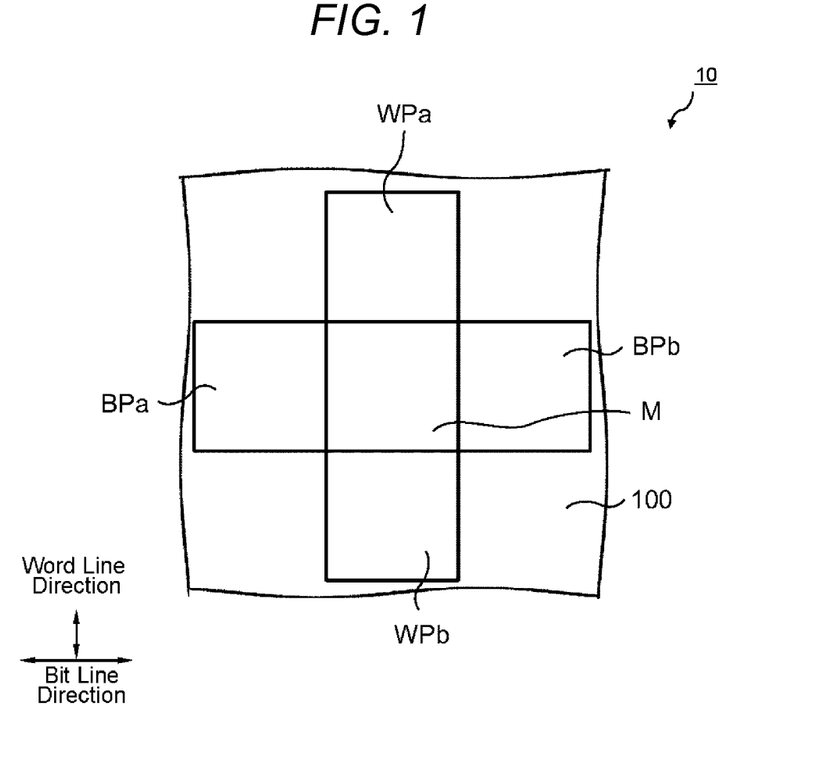
FIG. 1 is a plan view of a memory cell array of a storage device according to a first embodiment.

FIG. 1 is a plan view which schematically shows an entire memory cell array 10 of a storage device according to a first embodiment.

As shown in FIG. 1, a semiconductor substrate (for example, silicon substrate) 100 is provided. A peripheral circuit (not shown) is formed in, for example, an upper layer portion of the semiconductor substrate 100.

A memory unit M of a square type is provided above the semiconductor substrate 100 as viewed from above the substrate 100. Two word line pull-out sections WPa and WPb are provided on both sides of the memory unit M in a word line direction. Moreover, two bit line pull-out sections BPa and BPb are provided on both sides of the memory unit M in a bit line direction.

Figure 2:
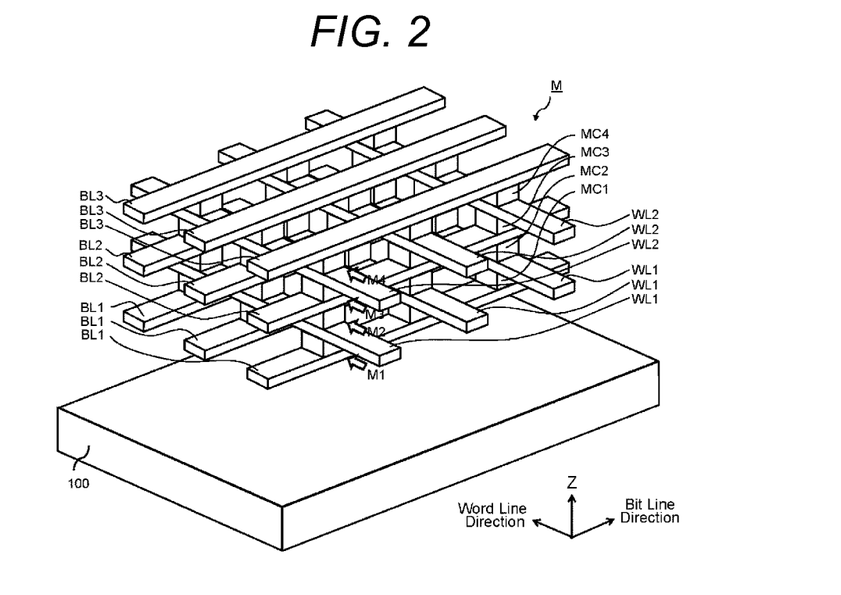
FIG. 2 is a perspective view which shows a schematic configuration of a memory unit of the storage device according to the first embodiment.

FIG. 2 is a perspective view which shows a basic configuration of the memory unit M of the memory cell array 10. The memory unit M includes four memory cell array layers M1, M2, M3, and M4 which are stacked in a Z direction. The number of memory cell array layers M is not limited to four layers, and may be any number equal to or more than one.

A first bit line BL1, a first word line WL1, a second bit line BL2, a second word line WL2, and a third bit line BL3 are arranged on the semiconductor substrate 100 in this order from the semiconductor substrate 100 side. In the following, when a distinction is not required, the first bit line BL1, the second bit line BL2, and the third bit line BL3 are referred to as a bit line BL, and the first word line WL1 and the second word line WL2 are referred to as a word line WL.

In addition, an extending direction of the word line WL is referred to as a "word line direction", and an extending direction of the bit line BL is referred to as a "bit line direction". In addition, a direction perpendicular to a top surface of the semiconductor substrate 100 is referred to as a "Z direction".

A memory cell MC is formed between a bit line and a word line. As shown in FIG. 2, a memory cell MC1 is formed between the first bit line BL1 and the first word line WL1, a memory cell MC2 is formed between the first word line WL1 and the second bit line BL2, a memory cell MC3 is formed between the second bit line BL2 and the second word line WL2, and a memory cell MC4 is formed between the second word line WL2 and the third bit line BL3.

The memory cell array layer M1 includes a plurality of memory cells MC1 arranged in an array in the word line direction and the bit line direction. In the same manner, the memory cell array layer M2 includes a plurality of memory cells MC2 arranged in an array, the memory cell array layer M3 includes a plurality of memory cells MC3 arranged in an array, and the memory cell array layer M4 includes a plurality of memory cells MC4 arranged in an array.

Hereinafter, when there is no distinction among the memory cells MC1, MC2, MC3, and MC4, the memory cells are simply referred to as the memory cell MC. When there is no distinction among the memory cell array layers M1, M2, M3, and M4, the memory cell array layers are simply referred to as the memory cell array layer M.

Figure 3:
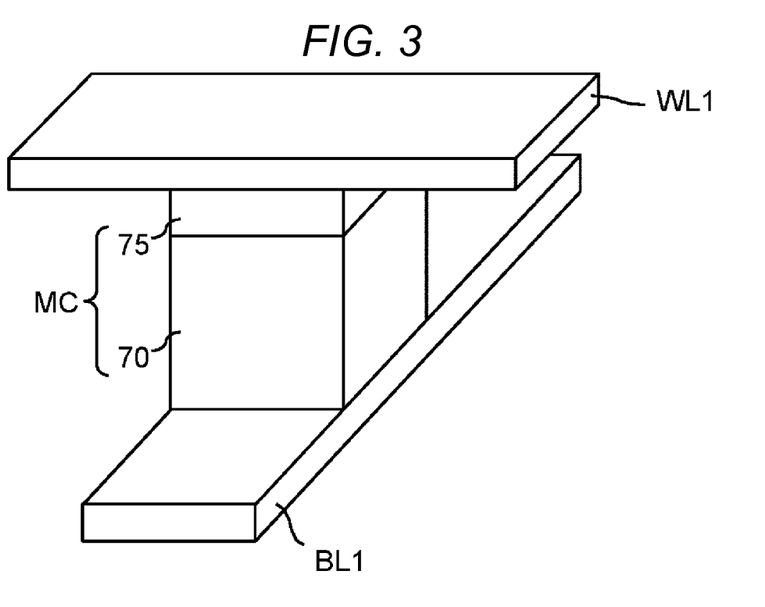
FIG. 3 is a perspective view which shows a schematic configuration of a memory cell of the storage device according to the first embodiment.

FIG. 3 is a view which schematically shows a basic configuration of the memory cell MC. FIG. 3 illustrates the memory cell MC1 as an example of the memory cell MC.

The memory cell MC includes, for example, an element selecting film 70, and a variable resistance film 75 on the element selecting film.

The element selecting film 70 is a film which rectifies a current to the memory cell MC. The element selecting film 70 is, for example, a silicon diode.

The variable resistance film 75 is a film, for example, a metal oxide film, in which a filament is formed when a voltage is applied thereto, to lower an electric resistance value thereof, and in which the filament shrinks when a voltage is applied thereto again to increase the electric resistance value thereof. In other words, the variable resistance film 75 in a low resistance state is interpreted as "0", and the variable resistance film 75 in a high resistance state is interpreted as "1", and thereby it is possible to store, for example, binary data in the memory cell MC. Of course, the low resistance state may be interpreted as "1", and the high resistance state may be interpreted as "0".

Memory cells of various types of memories such as a resistance change memory (ReRAM), a phase change memory (PCRAM), a magnetoresistive memory (MRAM), and the like may be used as the memory cell MC.

Figure 4:
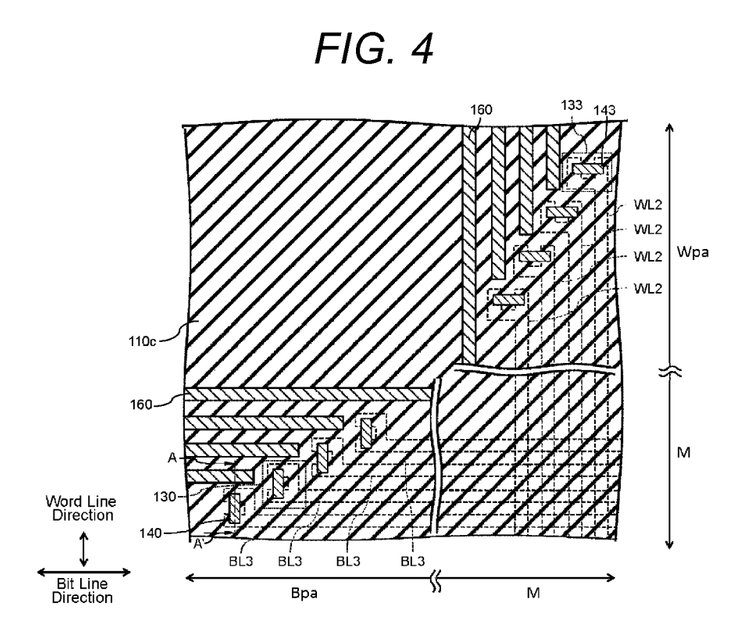
FIG. 4 is a schematic plan view of a memory unit, a bit line pull-out section, and a word line pull-out section of the memory cell array of the storage device according to the first embodiment.

FIG. 4 is a view which schematically shows the memory cell array 10 according to the embodiment. FIG. 4 is a planar layout after a word line contact 143 which electrically connects the second word line WL2 and a lower layer wiring (not shown) and a bit line contact 140 which electrically connects the third bit line BL3 and a lower layer wiring (not shown) are formed, and then an upper wiring layer 160 is formed.

As shown in FIG. 4, the bit line pull-out section BPa is provided in a bit line direction of the memory unit M, and the word line pull-out section WPa is provided in a word line direction of the memory unit M. The bit line pull-out section BPb and the word line pull-out section WPb are also provided in a bit line direction and a word line direction on an opposite side (not shown) of the memory unit M, respectively.

The third bit line BL3 is arranged to extend from the memory unit M into the bit line pull-out section BPa. The third bit line BL3 is connected to the bit line contact 140 at an end of the bit line contact 140. For example, as shown in FIG. 4, the end of the third bit line BL3 is divided into two. The bit line contact 140 is provided to overlap the bit line which is divided into two. A portion in which the third bit line BL3 is divided into two is referred to as a bit line connecting portion 130.

The second word line WL2 is provided to extend from the memory unit M into the word line pull-out section WPa. In the same manner as in the bit line pull-out section BPa, the second word line WL2 is connected to the word line contact 143 at an end of the word line contact 143. For example, as shown in FIG. 4, the second word line WL2 is divided into two. The word line contact 143 is provided to overlap the second word line WL2 which is divided into two. Hereinafter, a portion in which the second word line WL2 is divided into two is referred to as a word line connecting portion 133.

One or more upper wiring layers 160 are arranged around the bit line contact 140 and the word line contact 143. A pattern of the upper wiring layer 160 shown in FIG. 4 is an example, and the upper wiring layer 160 of any pattern may be provided.

Subsequently, cross-sections of the bit line contact 140 and the upper wiring layer 160 will be described.

Figure 5A:
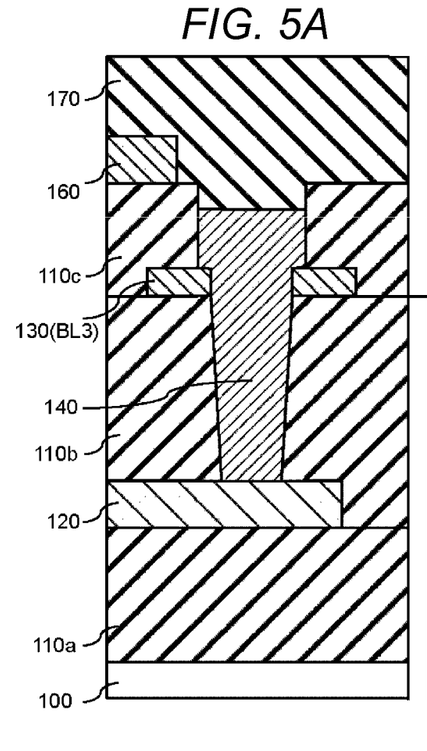
FIGS. 5A and 5B are schematic cross-sectional views of a bit line contact and a contact that electrically connects an upper wiring to a lower wiring layer of the storage device according to the first embodiment.
Figure 5B:
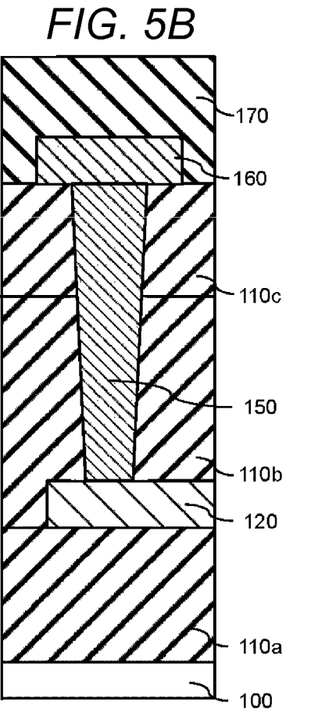

FIG. 5A is a view which schematically shows the bit line contact 140. That is, FIG. 5A is a view which shows a cross-section taken along line A-A' of FIG. 4. FIG. 5B is a view which schematically shows a cross-section of a contact 150 which connects the upper wiring layer 160 and a lower wiring layer 120. The contact 150 is any contact which electrically connects the upper wiring layer 160 and the lower wiring layer 120, and is, for example, a contact and the like which are formed in a peripheral circuit of the storage device.

A first interlayer insulating film 110a is provided on the semiconductor substrate 100. The lower wiring layer 120 is provided on a portion on the first interlayer insulating film 110a. The lower wiring layer 120 is electrically connected to, for example, a row decoder and a column decoder.

A second interlayer insulating film 110b is provided on the first interlayer insulating film 110a and the lower wiring layer 120. The bit line connecting portion 130 is provided on a portion on the second interlayer insulating film 110b. A third interlayer insulating film 110c is provided on the second interlayer insulating film 110b and the bit line connecting portion 130. The upper wiring layer 160 is provided on the third interlayer insulating film 110c. An upper insulating film 170 is provided on the third interlayer insulating film 110c and the upper wiring layer 160.

A bit line contact 140 is provided for the bit line connecting portion 130.

The bit line contact 140 is provided to reach a top surface of the lower wiring layer 120 through a portion of the second interlayer insulating film 110b and the third interlayer insulating film 110c. In addition, the bit line contact 140 is provided to be in contact with a portion of an upper side portion of the bit line connecting portion 130. That is, the bit line connecting portion 130 is electrically connected to the lower wiring layer 120 through the bit line contact 140.

The bit line contact 140 includes, for example, a metal film and a barrier metal film. The metal film includes, for example, copper, aluminum, and the like. The barrier metal film includes, for example, titanium, tantalum, titanium nitride, tantalum nitride, or a stacked film of these.

The upper insulating film 170 is provided directly on the upper face of the bit line contact 140 without the third interlayer insulating film 110c. In other words, the upper insulating film 170 is directly in contact with the bit line contact 140 at a region which overlaps the bit line contact 140 when viewed from above.

The upper wiring layer 160 includes, for example, the metal film and the barrier metal film. A material is the same as that of the bit line contact 140.

Subsequently, the contact 150 will be described using FIG. 5B. In the same manner as in FIG. 5A, the first interlayer insulating film 110a is provided on the semiconductor substrate 100. The lower wiring layer 120 is provided on the first interlayer insulating film 110a. The second interlayer insulating film 110b and the third interlayer insulating film 110c are provided on the first interlayer insulating film 110a and the lower wiring layer 120. The upper wiring layer 160 is provided on the third interlayer insulating film 110c. The upper wiring layer 160 is, for example, a power supply line. The upper insulating film 170 is provided on the third interlayer insulating film 110c and the upper wiring layer 160.

In addition, the contact 150 is provided through the second interlayer insulating film 110b and the third interlayer insulating film 110c.

A lower side portion of the contact 150 is electrically connected to an upper side portion of the lower wiring layer 120. Moreover, an upper side portion of the contact 150 is electrically connected to a lower side surface of the upper wiring layer 160.

The contact 150 includes, for example, a metal film and a barrier metal film. The material for the metal film is the same as the material for the metal film of the bit line contact 140, and the material for the barrier metal film is the same as the material for the barrier metal film of the bit line contact 140.

Subsequently, a manufacturing method will be described using FIGS. 6 to 12.

Figure 6A:
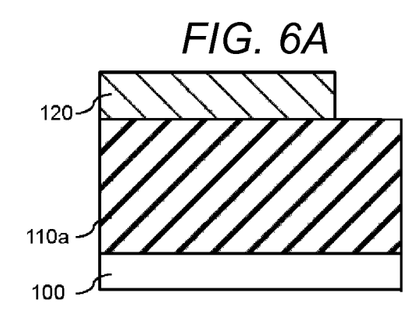
FIGS. 6A and 6B are schematic cross-sectional views which show one step of a method of manufacturing the storage device according to the first embodiment.
Figure 6B:
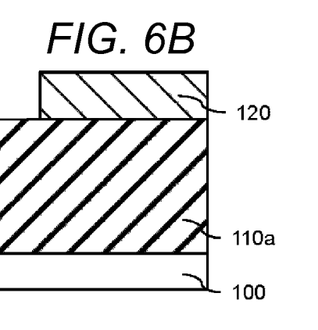

As shown in FIGS. 6A and 6B, the first interlayer insulating film 110a and the lower wiring layer 120 are formed on the semiconductor substrate 100. The first interlayer insulating film 110a is, for example, a silicon oxide film, which is formed using a chemical vapor deposition (CVD) method.

The lower wiring layer 120 includes, for example, the metal film and the barrier metal film. The metal film may be tungsten, copper, and the like. The barrier metal film may be titanium, tantalum, titanium nitride, tantalum nitride, or a stack of these. The metal film and the barrier metal film may be formed by, for example, the CVD method. The lower wiring layer 120 is formed as follows. The metal film and the barrier metal film are formed, a pattern is formed above them using a lithography method, and etching processing is performed using a reactive ion etching (RIE) method.

Figure 7A:
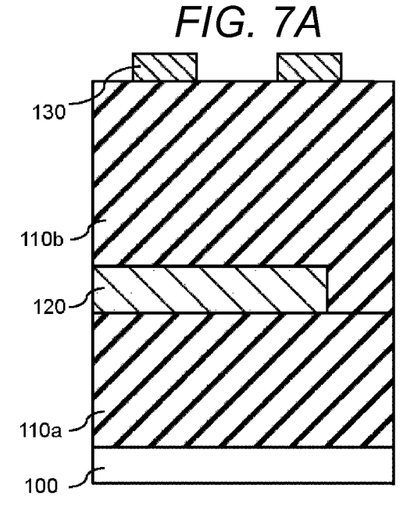
FIGS. 7A and 7B are schematic cross-sectional views which show another step of the method of manufacturing the storage device according to the first embodiment.
Figure 7B:
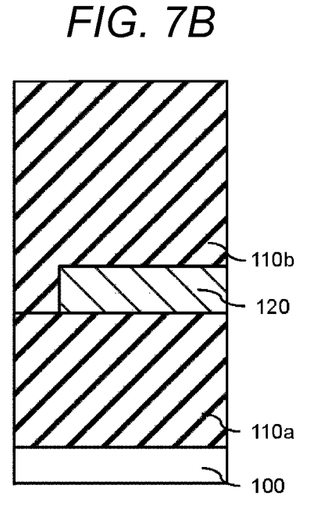

As shown in FIGS. 7A and 7B, the second interlayer insulating film 110b and the bit line connecting portion 130 are formed on the first interlayer insulating film 110a and the lower wiring layer 120. The second interlayer insulating film 110b is, for example, a silicon oxide film. Planarization may be performed using a chemical mechanical polishing (CMP) method and the like after film-formation.

The bit line connecting portion 130 is formed using the same material and method as those for the lower wiring layer 120. The etching processing of the bit line connecting portion 130 and processing of a third bit line of the memory unit M may be performed at the same time. Moreover, the processing and processing for some memory cells may be performed at the same time.

Figure 8A:
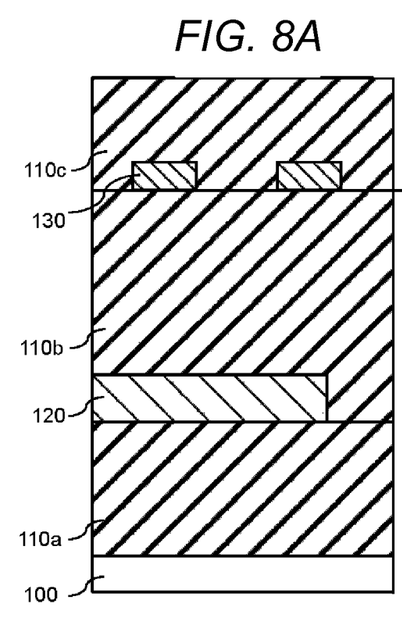
FIGS. 8A and 8B are schematic cross-sectional views which show another step of the method of manufacturing the storage device according to the first embodiment.
Figure 8B:
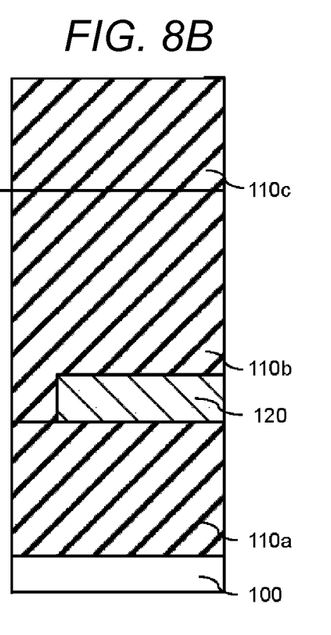

As shown in FIGS. 8A and 8B, the third interlayer insulating film 110c is formed on the bit line connecting portion 130 and the second interlayer insulating film 110b.

The third interlayer insulating film 110c is, for example, a silicon oxide film. Planarization may be performed using the CMP method and the like after film-formation.

Figure 9A:
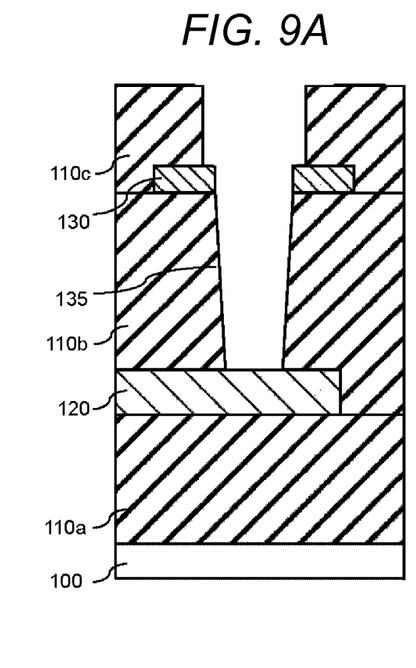
FIGS. 9A and 9B are schematic cross-sectional views which show another step of the method of manufacturing the storage device according to the first embodiment.
Figure 9B:
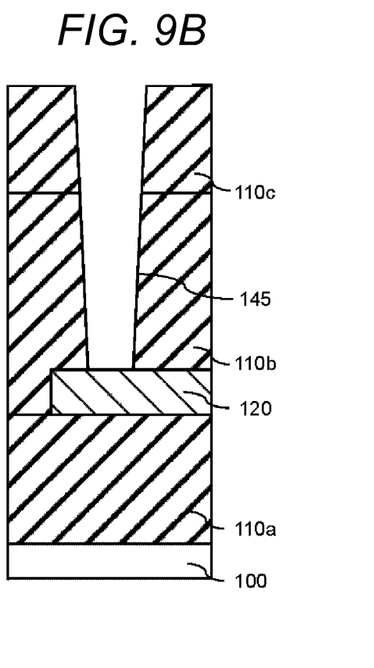

As shown in FIGS. 9A and 9B, a bit line contact hole 135 and a contact hole 145 are formed at the same time by an etching method such as an RIE method.

The bit line contact hole 135 and the contact hole 145 reach the upper side portion of the lower wiring layer 120 through the third interlayer insulating film 110c and the second interlayer insulating film 110b from a top surface of the third interlayer insulating film 110c.

The bit line contact hole 135 overlaps the bit line connecting portion 130 as viewed from the top surface. Therefore, as shown in FIGS. 9A and 9B, a portion of the bit line connecting portion 130 is exposed in the bit line contact hole 135. In other words, the bit line contact hole 135 is provided to overlap the bit line connecting portion 130 when viewed from a top of the upper wiring layer 160 in a direction perpendicular to the semiconductor substrate 100.

Figure 10A:
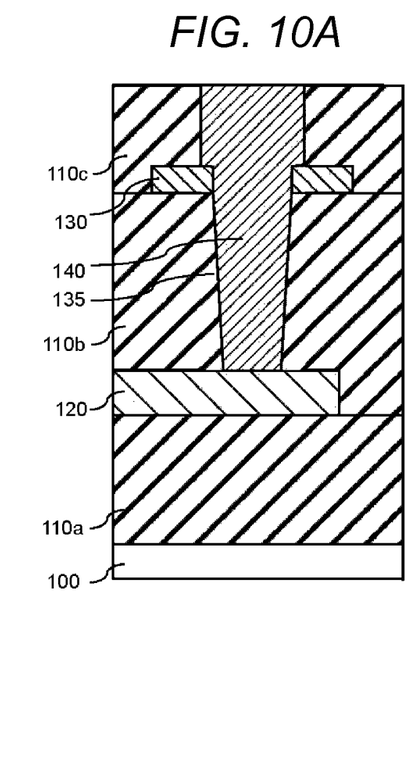
FIGS. 10A and 10B are schematic cross-sectional views which show another step of the method of manufacturing the storage device according to the first embodiment.
Figure 10B:
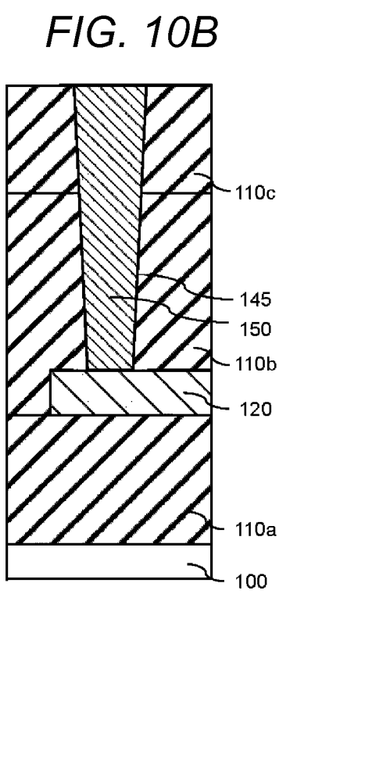

As shown in FIGS. 10A and 10B, the bit line contact 140 and the contact 150 are formed.

The bit line contact 140 and the contact 150 are formed by performing planarization using the CMP method after the metal layer and the barrier metal layer are formed, e.g., by sputtering or metal-organic chemical vapor deposition method. The metal film uses tungsten, copper, and the like. The barrier metal film uses titanium, tantalum, titanium nitride, tantalum nitride, or a stack of these.

Figure 11A:
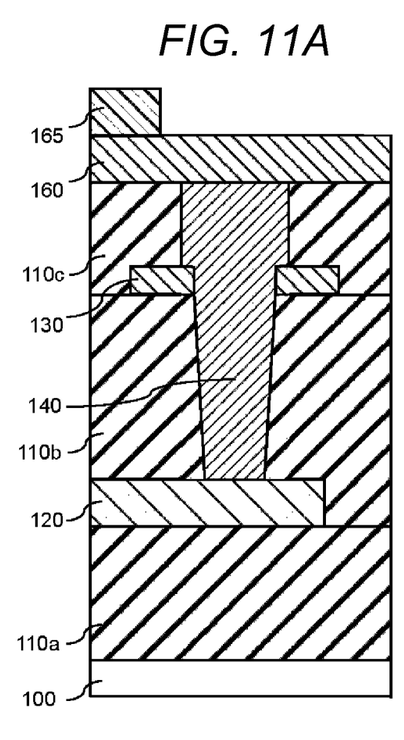
FIGS. 11A and 11B are schematic cross-sectional views which show another step of the method of manufacturing the storage device according to the first embodiment.
Figure 11B:
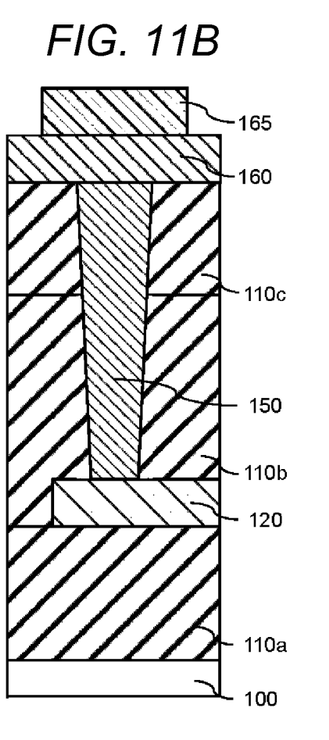

As shown in FIGS. 11A and 11B, the upper wiring layer 160 and a mask pattern 165 are formed above the bit line contact 140, the contact 150, and the third interlayer insulating film 110c.

The upper wiring layer 160 is of the same material as that of the lower wiring layer 120. The mask pattern 165 is formed by coating, for example, the upper wiring layer 160 with a resist material and the like and using the lithography method.

The upper wiring layer 160 is of the same material as that of the bit line contact 140. Using the same material facilitates the etching processing on a top of the bit line contact 140 when performing the etching processing on the upper wiring layer 160 to be described later.

The mask pattern 165 is formed in a region overlapping the contact 150 as viewed from the above, but the mask pattern 165 is not formed in a region overlapping the bit line contact 140 as viewed from the above.

Figure 12A:
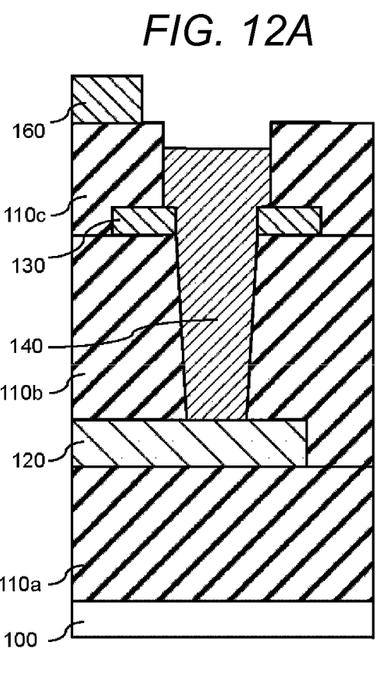
FIGS. 12A and 12B are schematic cross-sectional views which show another step of the method of manufacturing the storage device according to the first embodiment.
Figure 12B:
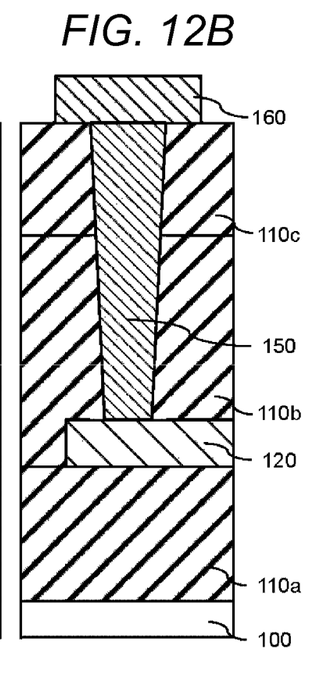

The mask pattern 165 is used as a mask material and the upper wiring layer 160 is etched by the RIE method. Then, any remaining portions of the mask pattern 165 is removed by an asking method. As a result, as shown in FIGS. 12A and 12B, a portion of the upper side portion of the bit line contact 140 is etched. This process causes a height of a top surface of the bit line contact 140 to be formed lower than a height of a top surface of the contact 150. When the upper wiring layer 160 and the bit line contact 140 contain the same metal material, etching of a portion of the upper side portion of the bit line contact 140 is facilitated.

During etching processing of the upper wiring layer 160, the upper wiring layer 160 is made of a metal material that etches much faster than a silicon oxide film and the like used for an interlayer insulating film, so that the interlayer insulating film is hardly etched at all. That is, when performing the etching processing on the upper wiring layer 160, it is possible to perform the etching processing on a top of the bit line contact 140 much faster than the third interlayer insulating film 110c by continuously performing the etching processing at a desired time after the processing of the upper wiring layer 160. In other words, a height of the top surface of the bit line contact 140 is formed to be lower than a height of a top surface of the contact 150, and is formed to be even lower than a bottom surface of the upper wiring layer 160.

In addition, in the etching of the upper wiring layer 160 described above, the upper wiring layer 160 retreats from the bit line contact 140 by side etching. This retreat causes a distance between the bit line contact 140 and the upper wiring layer 160 to be further increased.

Then, the upper insulating film 170 is formed, and then is planarized by the CMP method and the like, and thereby it is possible to form a shape as shown in FIGS. 5A and 5B. Then, it is possible to form the storage device according to the embodiment using a general manufacturing method.

According to the embodiment, the top surface of the bit line contact 140 is provided to be lower than the bottom surface of the upper wiring layer 160. Moreover, the upper wiring layer 160 is retreated from the bit line contact 140, so that it is possible to sufficiently ensure a distance between the upper wiring layer 160 and the bit line contact 140. That is, it is possible to improve a breakdown voltage between the upper wiring layer 160 and the bit line contact 140, and it is possible to obtain a highly reliable storage device.

When it is possible to ensure a sufficient breakdown voltage by lowering the top surface of the bit line contact 140, it is possible to form the upper wiring layer 160 closer to the bit line contact 140. That is, the storage device may be miniaturized. Then, since an extra wiring length is shortened in accordance with the miniaturization, it is possible to reduce a wiring resistance from the wiring length and to improve electrical characteristics.

According to the embodiment, it is possible to form the bit line contact hole 135 and the contact hole 145 for respective contacts which are connected to the lower wiring layer using the same etching processing, and the number of processing processes may be decreased compared to a case of separately forming these. Then, since the number of processing processes is decreased, it is possible to improve yield, and to manufacture an inexpensive storage device. In addition, it is also possible to reduce time required for manufacture.

Subsequently, a modification example of the embodiment will be described.

Figure 13:
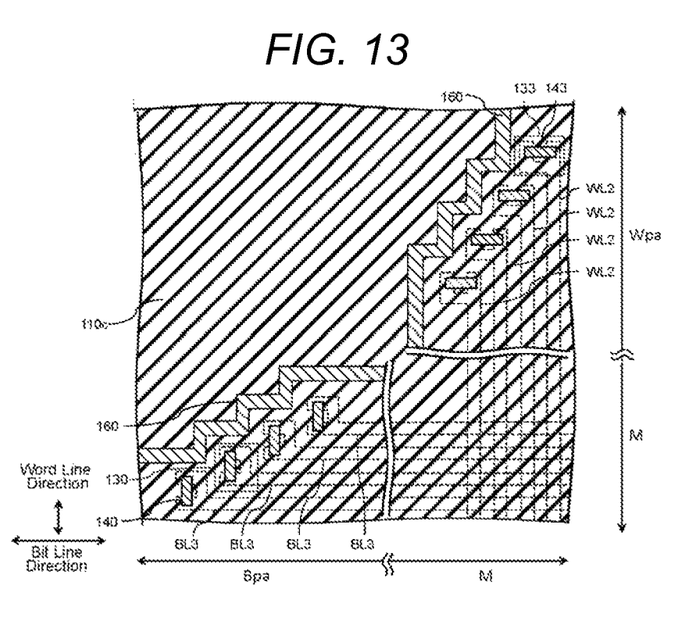
FIG. 13 is a schematic plan view of a memory unit, a bit line pull-out section, and a word line pull-out section of a memory cell array of the storage device according to a modification example of the first embodiment.

FIG. 13 is an example of another layout of the upper wiring layer 160. In this manner, one upper wiring layer 160 may be arranged around a plurality of bit line contacts 140. Disposition in this manner improves a degree of freedom in disposition of the upper wiring layer 160, and facilitates a decrease in size of the storage device.

Moreover, an example is shown, which includes the element selecting film 70 that uses a silicon diode and the variable resistance film 75 that uses a metal oxide as the memory cell MC; however, the embodiment is not limited thereto. For example, the element selecting film 70 may not be provided. In addition, the variable resistance film 75 is not limited to a metal oxide film. For example, an ion supplying film which includes, for example, silver, may be provided on the variable resistance film 75 using an amorphous silicon in the variable resistance film 75. In this case, by applying a positive voltage which makes the ion supplying film a positive electrode and makes the variable resistance film 75 a negative electrode, the silver included in the ion supplying film is ionized to move in the variable resistance film 75, forms a filament in the variable resistance film 75, and lowers an electric resistance value of the variable resistance film 75. In addition, by applying a reverse voltage, silver which forms a filament in the variable resistance film 75 is ionized to move toward the ion supplying film. Accordingly, the filament is interrupted and the electric resistance value of the variable resistance film 75 is increased.

In addition, description is performed using the upper wiring layer 160 arranged around the bit line contact 140; however, the upper wiring layer 160 arranged around the word line contact 143 may also have the same structure.

Second Embodiment

A second embodiment will be described using FIGS. 14A to 14C.

Figure 14A:
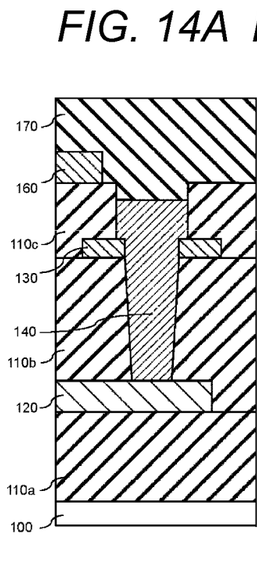
FIGS. 14A to 14C are schematic cross-sectional views of a bit line contact and a contact electrically connecting an upper wiring to a lower wiring layer of the storage device according to a second embodiment.
Figure 14B:
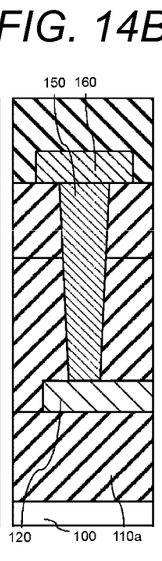

The bit line contact 140 and the contact 150 shown in FIG. 14A and FIG. 14B are the same as the bit line contact 140 and the contact 150 according to the first embodiment shown in FIGS. 5A and 5B. The second embodiment is different from the first embodiment in that the second embodiment includes an upper connection bit line contact 200 shown in FIG. 14C in addition to the bit line contact 140 and the contact 150.

The upper connection bit line contact 200 is provided to pass through the second interlayer insulating film 110b and the third interlayer insulating film 110c. The upper connection bit line contact 200 is similar to the bit line contact in that the upper connection bit line contact 200 is connected to the bit line connecting portion 130 and the lower wiring layer 120. However, the upper connection bit line contact 200 is different from the bit line contact 140 in that the upper connection bit line contact 200 has a top surface higher than a top surface of the bit line contact 140 and is electrically connected to the upper wiring layer 160.

A manufacturing method in the second embodiment will be described using FIGS. 15A to 16C. The upper connection bit line contact 200 is made using the same manufacturing method for the bit line contact 140 as in the first embodiment, description of FIGS. 1 to 11 will be omitted. In the following, the same manufacturing method as in the first embodiment will be described in duplicate when necessary.

Figure 15A:
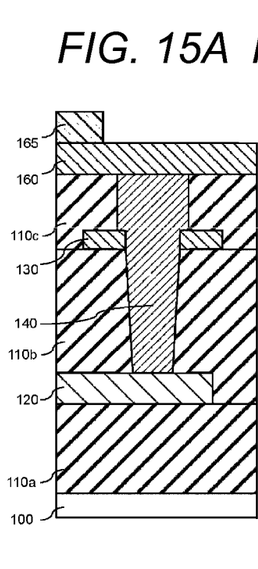
FIGS. 15A to 15C are schematic plan views which show one step of a method of manufacturing the storage device according to the second embodiment.
Figure 15B:
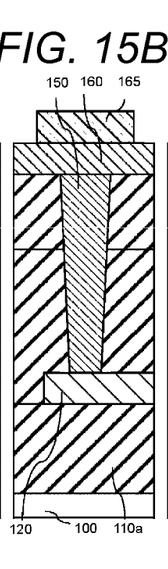
Figure 15C:
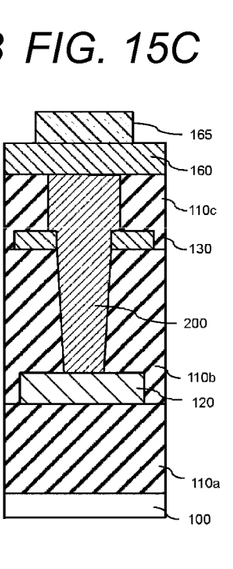

As shown in FIGS. 15A to 15C, the upper wiring layer 160 and the mask pattern 165 are formed. The mask pattern 165 is formed in a region overlapping the upper connection bit line contact 200, but is not formed in a region overlapping the bit line contact 140 as viewed from the above.

Figure 16A:
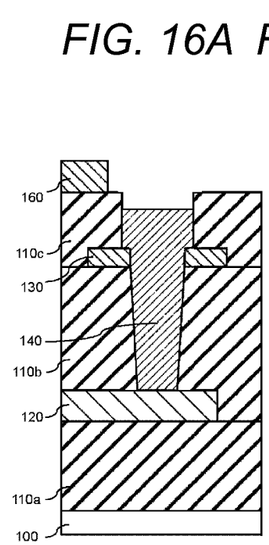
FIGS. 16A to 16C are schematic cross-sectional views which show another step of the method of manufacturing the storage device according to the second embodiment.
Figure 16B:
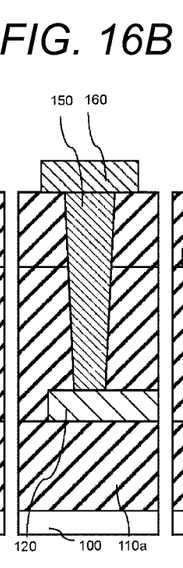
Figure 16C:
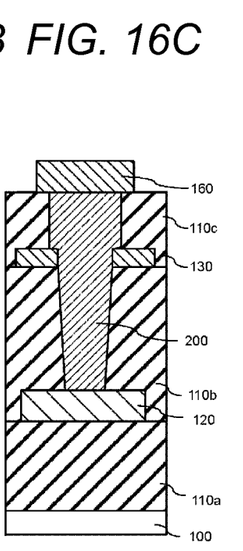

As shown in FIGS. 16A to 16C, when setting the mask pattern 165 to be a mask material and performing the etching processing, the upper wiring layer 160 is formed on the upper connection bit line contact 200. Therefore, the upper wiring layer 160 becomes a mask, and a top of the upper connection bit line contact 200 is not etched.

Figure 14C:
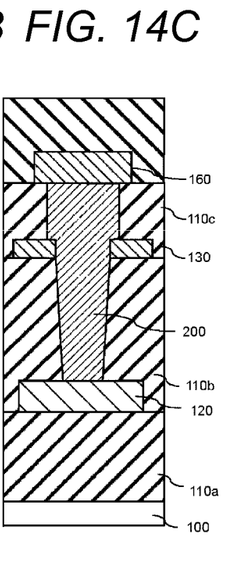

After the upper insulating film 170 is formed, a shape shown in FIGS. 14A to 14C is obtained by performing planarization using a method such as the CMP method. Thereafter, it is possible to form the storage device of the embodiment according to a general manufacturing method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a first wiring layer;
   a second wiring layer above the first wiring layer;
   a third wiring layer above the second wiring layer;
   a first contact in electrical contact with the first and third wiring layers and electrically insulated from the second wiring layer;
   a second contact in electrical contact with the first and second wiring layers and electrically insulated from the third wiring layer; and
   an insulating layer provided on an upper surface of the second contact and the third wiring layer
   wherein an upper surface of the first contact is higher than the upper surface of the second contact, and the upper surface of the second contact is higher than an upper surface of the second wiring layer.

2. The device according to claim 1, wherein the upper surface of the second contact is higher than an upper surface of the second wiring layer.

3. The device according to claim 1, wherein the insulating layer electrically insulates the second contact from the third wiring layer.

4. The device according to claim 1, wherein the first contact and the second contact are made of the same material.

5. The device according to claim 4, wherein the first contact and the second contact are formed using chemical vapor deposition.

6. The device according to claim 1, further comprising:
   a third contact in electrical contact with the first, second, and third wiring layers.

7. The device according to claim 6, wherein the first contact, the second contact, and the third contact are made of the same material.

8. The device according to claim 7, wherein the first contact, the second contact, and the third contact are formed using chemical vapor deposition.

9. The device according to claim 1, further comprising:
   a memory cell, wherein the second wiring layer is electrically connected to the memory cell.

10. The device according to claim 1, wherein the insulating layer is directly contacting the upper surface of the second contact.

11. A storage device comprising:
    a first wiring layer;
    a second wiring layer above the first wiring layer in a first direction;
    a third wiring layer above the second wiring layer in the first direction;
    a first contact extending in the first direction from the first wiring layer to the third wiring layer and electrically connecting the first and third wiring layers, the first contact electrically insulated from the second wiring layer;
    a second contact extending in the first direction from the first wiring layer to the second wiring layer and electrically connecting the first and second wiring layers, the second contact electrically insulated from the third wiring layer; and
    an insulating layer directly contacting an upper surface of the second contact and the third wiring layer,
    wherein an upper surface of the first contact is higher than the upper surface of the second contact in the first direction.

12. The device according to claim 11, wherein the upper surface of the second contact is higher than an upper surface of the second wiring layer in the first direction.

13. The device according to claim 11, wherein the insulating layer is between the second contact from the third wiring layer in a second direction crossing the first direction.

14. The device according to claim 11, wherein the first contact and the second contact are made of the same material.

15. The device according to claim 14, wherein the first contact and the second contact are formed using chemical vapor deposition.

16. The device according to claim 11, further comprising:
    a third contact extending in the first direction from the first wiring layer to the third wiring layer and electrically connecting the first, second, and third wiring layers.

17. The device according to claim 16, wherein the first contact, the second contact, and the third contact are made of the same material.

18. The device according to claim 17, wherein the first contact, the second contact, and the third contact are formed using chemical vapor deposition.

19. The device according to claim 11, further comprising:
    a memory cell, wherein the second wiring layer is electrically connected to the memory cell.

* * * * *